(12) United States Patent
Tai et al.

(10) Patent No.: US 12,232,266 B2
(45) Date of Patent: Feb. 18, 2025

(54) CONNECTION METHOD FOR CHIP AND CIRCUIT BOARD, AND CIRCUIT BOARD ASSEMBLY AND ELECTRONIC DEVICE

(71) Applicant: INTELLIMICRO MEDICAL CO., LTD., Changsha (CN)

(72) Inventors: Yu-chong Tai, Changsha (CN); Changlin Pang, Changsha (CN); Xihua Xia, Changsha (CN)

(73) Assignee: INTELLIMICRO MEDICAL CO., LTD., Changsha (CN)

( * ) Notice: Subject to any disclaimer, the term of this patent is extended or adjusted under 35 U.S.C. 154(b) by 206 days.

(21) Appl. No.: 18/055,946

(22) Filed: Nov. 16, 2022

(65) Prior Publication Data

US 2023/0081618 A1    Mar. 16, 2023

Related U.S. Application Data

(63) Continuation of application No. PCT/CN2021/079517, filed on Mar. 8, 2021.

(30) Foreign Application Priority Data

May 18, 2020    (CN) .......................... 202010420625.9

(51) Int. Cl.
*H05K 1/02*        (2006.01)
*H05K 1/18*        (2006.01)
(Continued)

(52) U.S. Cl.
CPC ........... *H05K 1/181* (2013.01); *H05K 1/0266* (2013.01); *H05K 3/0008* (2013.01); *H05K 3/108* (2013.01);
(Continued)

(58) Field of Classification Search
CPC ...... H05K 1/02; H05K 1/0201; H05K 1/0206; H05K 1/0266; H05K 1/181; H05K 3/0008;
(Continued)

(56) References Cited

U.S. PATENT DOCUMENTS 5,681,757 A * 10/1997 Hayes ..................... H01L 24/75
                                                      228/175
5,842,273 A    12/1998 Schar
(Continued)

FOREIGN PATENT DOCUMENTS

CN        1377217 A        10/2002
CN        1396797 A        2/2003
(Continued)

OTHER PUBLICATIONS

Extended European Search Report of the corresponding EP application No. 21809258.3 was issued on Mar. 18, 2024 from the EPO. (16 pages).

(Continued)

*Primary Examiner* — Xiaoliang Chen
(74) *Attorney, Agent, or Firm* — Grossman, Tucker, Perreault & Pfleger, PLLC

(57) ABSTRACT

A connection method for a chip and a circuit board includes: placing the circuit board on the chip, the circuit board having a first surface in contact with the chip having a plurality of contacts, and the circuit board having a plurality of through holes aligned with the plurality of contacts respectively; placing a mask on a second surface of the circuit board, the mask having a plurality of openings aligned with the plurality of through holes respectively; covering a surface of the mask with a conductive adhesive to fill the plurality of through holes with the conductive adhesive; and keeping portions of the conductive adhesive that are respectively in (Continued)

the plurality of through holes to be spaced apart from each other. The portions of the conductive adhesive that fill the plurality of through holes remain to provide an electrical connection between the circuit board and the chip.

15 Claims, 8 Drawing Sheets

(51) Int. Cl.
*H05K 3/00* (2006.01)
*H05K 3/08* (2006.01)
*H05K 3/10* (2006.01)
*H05K 3/30* (2006.01)
*H05K 3/32* (2006.01)
*H05K 3/42* (2006.01)

(52) U.S. Cl.
CPC ............ *H05K 3/305* (2013.01); *H05K 3/321* (2013.01); *H05K 3/428* (2013.01); *H05K 2201/09545* (2013.01); *H05K 2201/09827* (2013.01); *H05K 2201/10628* (2013.01); *H05K 2203/0455* (2013.01); *H05K 2203/0557* (2013.01); *H05K 2203/1105* (2013.01); *H05K 2203/143* (2013.01); *H05K 2203/1438* (2013.01)

(58) Field of Classification Search
CPC ...... H05K 3/0061; H05K 3/108; H05K 3/305; H05K 3/321; H05K 3/428; H05K 2201/062; H05K 2201/09063; H05K 2201/09072; H05K 2201/09545; H05K 2201/09827; H05K 2201/10628; H05K 2201/10674; H05K 2203/0073; H05K 2203/0455; H05K 2203/0557; H05K 2203/143; H05K 2203/1105; H05K 2203/1438; H01L 21/563; H01L 21/6715; H01L 24/27; H01L 24/29; H01L 24/75; H01L 24/81; H01L 24/83; H01L 24/743
USPC .................. 361/760, 720; 174/252; 257/778, 257/E21.503, E21.505, E21.511, E21.514; 438/15, 118, 119; 29/25.01; 156/46; 228/175; 700/121
See application file for complete search history.

(56) References Cited

U.S. PATENT DOCUMENTS

| | | | |
|---|---|---|---|
| 6,205,028 B1 * | 3/2001 | Matsumura | H05K 1/0201 361/720 |
| 2003/0111258 A1 | 6/2003 | Pearson et al. | |
| 2004/0195002 A1 | 10/2004 | Higuchi et al. | |
| 2005/0016765 A1 | 1/2005 | Higuchi et al. | |
| 2006/0115583 A1 | 6/2006 | Takenaka et al. | |
| 2009/0080168 A1 | 3/2009 | Sugino | |
| 2011/0001222 A1 | 1/2011 | Nishimura et al. | |
| 2013/0014976 A1 | 1/2013 | Ishigaki et al. | |
| 2014/0168920 A1 | 6/2014 | Hondo | |

FOREIGN PATENT DOCUMENTS

| | | |
|---|---|---|
| CN | 1739322 A | 2/2006 |
| CN | 102933031 A | 2/2013 |
| CN | 103748977 A | 4/2014 |
| CN | 109152211 A | 1/2019 |
| CN | 110324984 A | 10/2019 |
| CN | 110557879 A | 12/2019 |
| CN | 111083879 A | 4/2020 |
| CN | 111629519 A | 9/2020 |
| JP | H0878828 A | 3/1996 |
| JP | H10209204 A | 8/1998 |
| JP | 2887644 B2 | 4/1999 |

OTHER PUBLICATIONS

First Office Action from related Chinese Appln. No. 202010420625.9, dated Nov. 17, 2020. English translation attached.
Second Office Action from related Chinese Appln. No. 202010420625.9, dated Jan. 11, 2021. English translation attached.
Written Opinion from corresponding PCT Appln. No. PCT/CN/2021/079517, dated May 27, 2021. English translation attached.
International Search Report from corresponding PCT Appln. No. PCT/CN2021/079517, dated May 27, 2021. English translation attached.
Partial European Search Report of the corresponding EP application No. 21809258.3 issued on Dec. 6, 2023 from the EPO. (16 pages).
Communication pursuant to Article 94(3) EPC of EP Corresponding Application 21809258.3 issued on Dec. 2, 2024 from the EPO. (3 Pages).

* cited by examiner

CONNECTION METHOD FOR CHIP AND CIRCUIT BOARD, AND CIRCUIT BOARD ASSEMBLY AND ELECTRONIC DEVICE

CROSS-REFERENCES TO RELATED APPLICATIONS

The present application is a continuation of International Patent Application No. PCT/CN2021/079517, entitled "CONNECTION METHOD FOR CHIP AND CIRCUIT BOARD, AND CIRCUIT BOARD ASSEMBLY AND ELECTRONIC DEVICE" filed on Mar. 8, 2021, which claims priority to Chinese Patent Application No. 202010420625.9 entitled "CONNECTION METHOD FOR CHIP AND CIRCUIT BOARD, AND CIRCUIT BOARD ASSEMBLY AND ELECTRONIC DEVICE" and filed with China National Intellectual Property Administration on May 18, 2020, the entire contents of both of which are incorporated herein by reference.

TECHNICAL FIELD

The present disclosure relates to the field of electronic circuitry, more particularly, to a connection method for a chip and a circuit board, a circuit board assembly and an electronic device.

BACKGROUND

With the popularization of electronic products and continuous development of electronic circuitry, integrated circuits (ICs) have been applied in electronic devices such as implantable devices, wearable devices, mobile phones, computers, cameras, displays and so on.

In the related art, an IC chip (for example, die) is usually packaged to be a packaged chip. The packaged chip is provided with a plurality of contacts for connection with a circuit board, and the plurality of contacts are configured to connect the integrated circuit in the packaged chip to the electrical board to form an electronic circuit. One of common ways of connecting a packaged chip to a circuit board is to solder the packaged chip to the circuit board. However, with the miniaturization of the electronic device and the packaged chip, the space occupied by the contacts is also reduced. When the packaged chip is soldered to the circuit board, the contacts on the packaged chip have a small volume and a large density, causing problems such as a high difficulty in the soldering process, a high occurrence probability of faulty solder joints, unstable solder joint connection, even short circuiting caused by interconnection of contacts, and open circuiting caused by disconnection of contacts from a metal layer of the circuit board.

Therefore, the connection method for a packaged chip and a circuit board in related art needs to be improved to solve the above-mentioned problems.

SUMMARY

In order to address the above-mentioned problems, the present disclosure aims to provide a connection method for a packaged chip or an IC chip (die) and a circuit board, a circuit board assembly and an electronic device, to enhance reliability of connection between the chip and the circuit board.

The connection method according to the present disclosure may be used for connection between a packaged chip and a circuit board or used for a direct connection between an un-packaged IC chip (die) and a circuit board, which can avoid a packaging step for the IC chip (die) and greatly reduce the size of the circuit board assembly and increase its compactness.

In the present disclosure, both the packaged chip and the IC chip (die) are collectively termed as a chip.

According to an embodiment of a first aspect of the present disclosure, a connection method for a chip and a circuit board is provided. The connection method includes: placing the circuit board on the chip, the circuit board having a first surface in contact with the chip, the chip having a plurality of contacts, and the circuit board having a plurality of through holes aligned with the plurality of contacts respectively; placing a mask on a second surface of the circuit board, the mask having a plurality of openings aligned with the plurality of through holes respectively; covering a surface of the mask with a conductive adhesive to fill the plurality of through holes with the conductive adhesive; and keeping portions of the conductive adhesive that are respectively in the plurality of through holes to be spaced apart from each other, wherein the portions of the conductive adhesive that fill the plurality of through holes remain so as to provide an electrical connection between the circuit board and the chip.

In the connection method for a chip and a circuit board in the embodiment of the present disclosure, by covering the mask with the conductive adhesive to fill the plurality of through holes with the conductive adhesive and keeping portions of the conductive adhesive that are respectively in the plurality of through holes to be spaced apart from each other, and the portions of the conductive adhesive that fill the plurality of through holes remain so as to provide an electrical connection between the circuit board and the chip, an electrical connection between the plurality of contacts and the circuit board can be formed in one time. The manufacturing process can be simplified and the reliability in the electrical connection between the chip and the circuit board can be guaranteed, thereby avoiding occurrence of short circuiting or open circuiting. The connection method is simple in process, can increase yield rate of the process and can guarantee a normal operation of the chip under a size constraint. Furthermore, the connection method is especially suitable for miniaturized electronic devices.

According to some embodiments of the present disclosure, the keeping the portions of the conductive adhesive that are respectively in the plurality of through holes to be spaced apart from each other includes removing the conductive adhesive on the surface of the mask.

According to some embodiments of the present disclosure, the keeping the portions of the conductive adhesive that are respectively in the plurality of through holes to be spaced apart from each other further includes removing the mask.

According to some embodiments of the present disclosure, the connection method further includes: performing, before the removing the conductive adhesive on the surface of the mask, a first baking process on the conductive adhesive; and/or performing, after the removing the mask, a second baking process on the conductive adhesive.

According to some embodiments of the present disclosure, the covering the surface of the mask with the conductive adhesive includes: performing a first baking process on the conductive adhesive; covering the surface of the mask with the conductive adhesive; removing the conductive adhesive on the surface of the mask; removing the mask; and performing a second baking process on the conductive adhesive.

According to some embodiments of the present disclosure, the circuit board further includes a first positioning hole. The method further includes: injecting, after the placing the circuit board on the chip, a first adhesive agent into the first positioning hole.

According to some embodiments of the present disclosure, the mask further includes a second positioning hole. The method further includes: injecting, after the placing the mask on the second surface of the circuit board, a second adhesive agent into the second positioning hole.

According to some embodiments of the present disclosure, the first positioning hole extends through the circuit board, and the first positioning hole is located in a non-metal region of the circuit board.

According to some embodiments of the present disclosure, the second positioning hole extends through the mask, and the second adhesive agent is connected to a non-metal region of the circuit board.

According to some embodiments of the present disclosure, each of the plurality of openings has a cross-sectional area greater than that of the through hole, and each of the plurality of through holes has a cross-sectional area greater than that of the contact.

According to some embodiments of the present disclosure, before the placing the circuit board on the chip, the connection method further includes: placing the chip into an accommodating slot of an operating station, the accommodating slot being connected with a vacuum tube to fix the chip.

According to an embodiment of a second aspect of the present disclosure, a circuit board assembly is provided. The circuit board assembly includes: a circuit board having a plurality of through holes; a chip located on a first surface of the circuit board, the chip having a plurality of contacts aligned with the plurality of through holes; and a conductive adhesive filled into each of the plurality of through holes, the conductive adhesive extending over a preset height from a second surface of the circuit board towards a direction that faces away from the second surface so as to form a free end, the free end of the conductive adhesive having a flat surface, the second surface being opposite to the first surface, and the conductive adhesive providing an electrical connection between the circuit board and the chip.

According to some embodiments of the present disclosure, the conductive adhesive has a step-shaped or T-shaped cross-section.

According to some embodiments of the present disclosure, the free end has a cross-sectional area greater than that of the conductive adhesive in each of plurality of the through holes.

According to some embodiments of the present disclosure, the circuit board includes a first insulation layer, a second insulation layer and a metal layer provided between the first insulation layer and the second insulation layer. Each of the plurality of through holes extends through the first insulation layer, the metal layer and the second insulation layer. Each of the plurality of through holes has a cross-sectional area in the second insulation layer that is greater than that in the first insulation layer to expose a part of a surface of the metal layer. The first surface is an exposed surface of the first insulation layer, and the second surface is an exposed surface of the second insulation layer.

According to an embodiment of a third aspect of the present disclosure, an electronic device is provided. The electronic device includes: the circuit board assembly produced using the connection method according to any of above-mentioned embodiments of the first aspect of the present disclosure or the circuit board assembly according to any of above-mentioned embodiments of the second aspect of the present disclosure.

In this technical solution provided in the present disclosure, the mask is covered by the conductive adhesive, and an electrical connection between the plurality of contacts and the circuit board can be formed in one time, the manufacturing process can be simplified and the reliability in the electrical connection between the chip and the circuit board can be guaranteed, thereby avoiding occurrence of short circuiting or open circuiting. The connection method is simple in process, can increase yield rate of the process and can guarantee a normal operation of the chip under a size constraint. The connection method is especially suitable for miniaturized electronic devices.

Further, the circuit board in the present disclosure includes a first insulation layer, a second insulation layer and a metal layer. Each through hole has a cross-sectional area in the second insulation layer that is greater than that in the first insulation layer to expose a part of a surface of the metal layer. In this way, it not only can reduce a contact resistance between the chip and the circuit board, but also can form a step-shaped conductive adhesive to increase bonding strength between the chip and the circuit board.

Additional aspects and advantages of the present disclosure will be partly given in the following description, and some parts of the present disclosure will become apparent through reading the following description or learned from practice of embodiments of the present disclosure.

BRIEF DESCRIPTION OF DRAWINGS

The above-mentioned and other objects, features and advantages of the present disclosure will become more clear upon reading the following description of the embodiments of the present disclosure with reference to the drawings, in which.

LIST OF REFERENCE NUMERALS

Figure 1A:
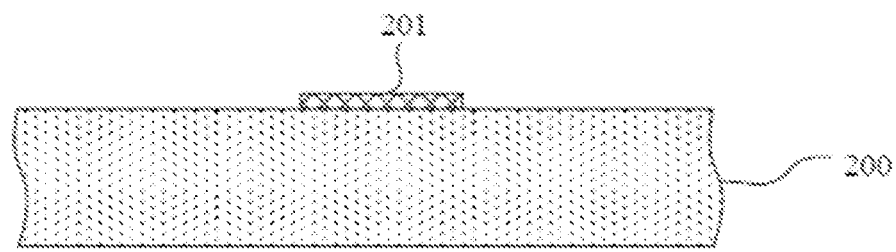
FIG. 1a to FIG. if illustrate sectional views showing stages in a connection method for a chip and a circuit board according to an embodiment of the present disclosure.

100: Circuit board; 110: Lead-in part; 111: First insulation layer; 112: Metal layer; 113: Second insulation layer; 114, 114a, 114b: Through hole; 115: First positioning hole; 120: Cable; 130: Stimulation end; 131: Stimulation electrode; 200: Chip; 201: Contact; 300: Mask; 301: Opening; 302: Second positioning hole; 310: Substrate; 311: First photoresist layer; 312: Mask layer;

313: Shielding layer; 314: Second photoresist layer; 400: Conductive adhesive; 500: Operating station; 501: Accommodating slot; 502: Guiding slot; 503: Vacuum pump joint.

DETAILED DESCRIPTION OF EMBODIMENTS

Embodiments of the present disclosure will be described in detail with reference to the drawings in the following. Throughout the drawings, same or similar elements are represented using same or similar reference numerals. For purpose of clearness, various parts in the drawings are not drawn to scale.

The detailed description of embodiments of the present disclosure will be given in the follows in conjunction with the drawings and the embodiments.

Figure 2A:
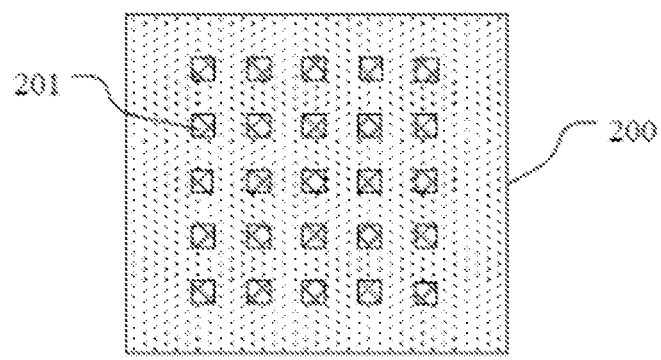
FIG. 2a to FIG. 2c illustrate top views showing one or more stages in a connection method for a chip and a circuit board according to an embodiment of the present disclosure.
Figure 2B:
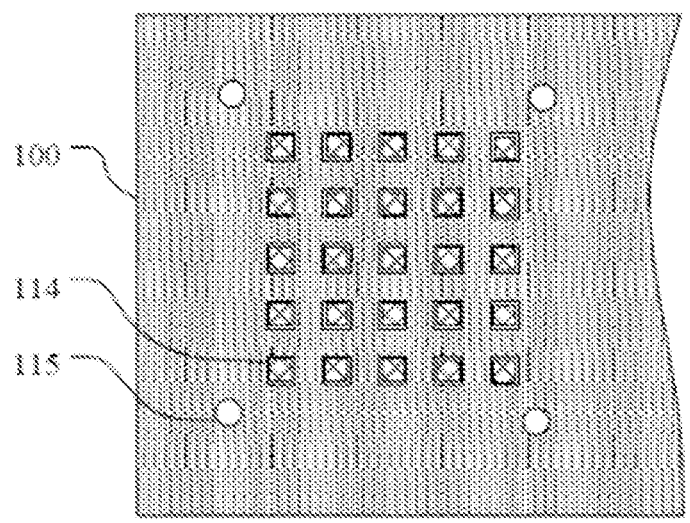
Figure 2C:
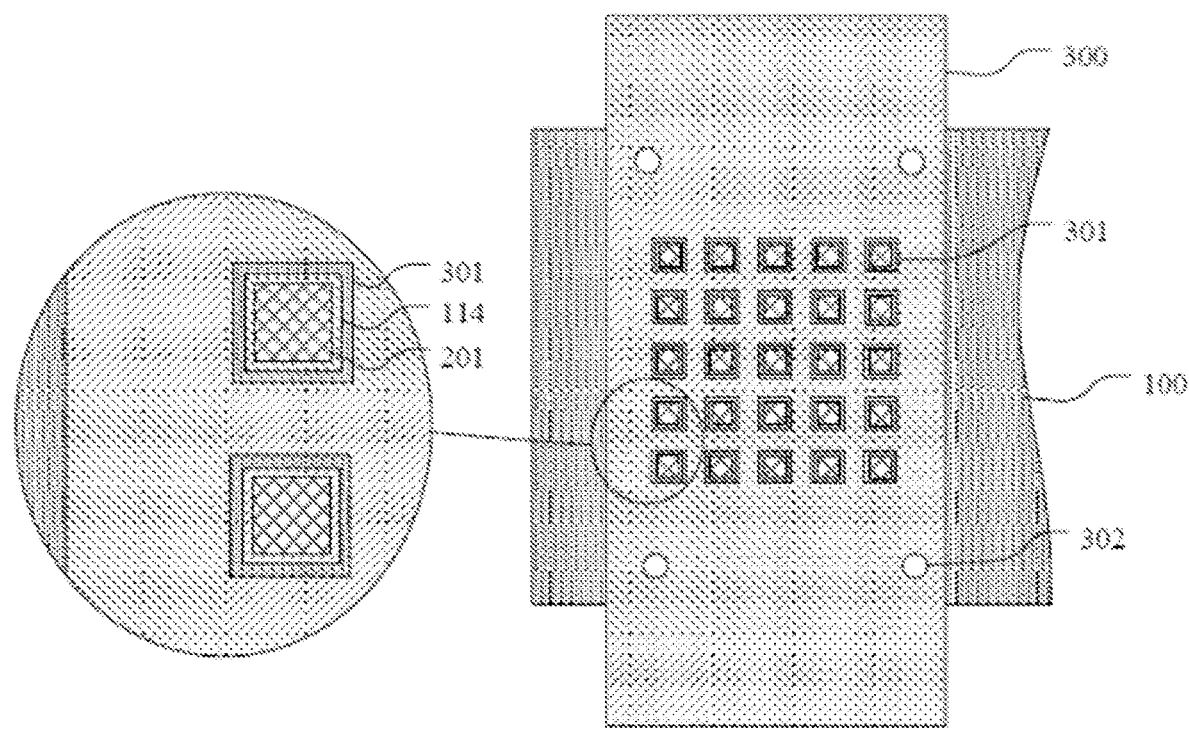
Figure 3:
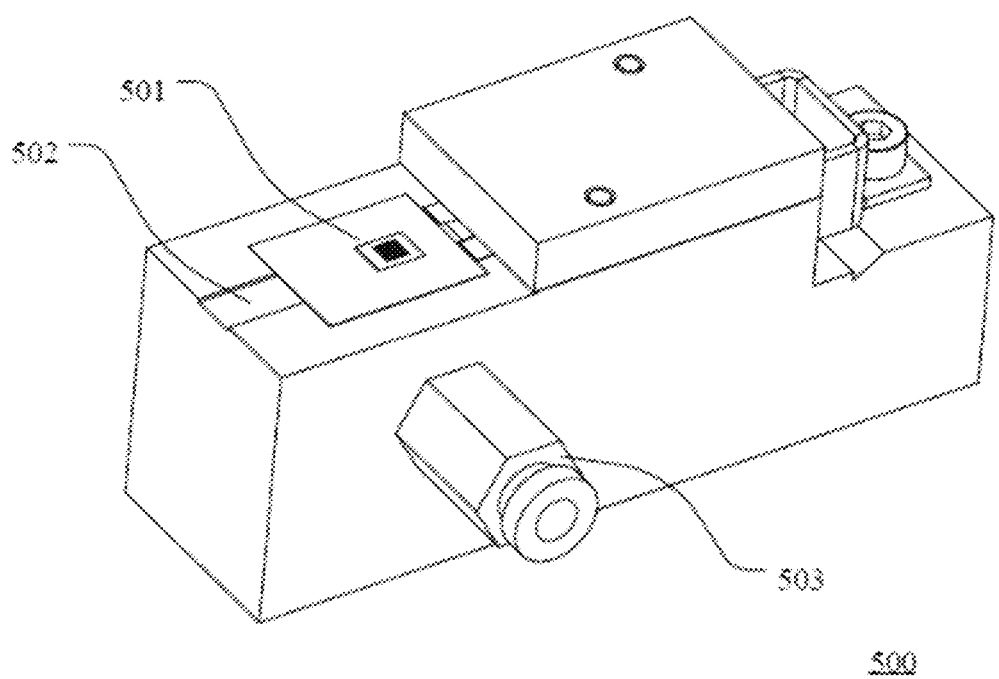
FIG. 3 illustrates a schematic diagram showing an operating station according to an embodiment of the present disclosure.
Figure 5A:
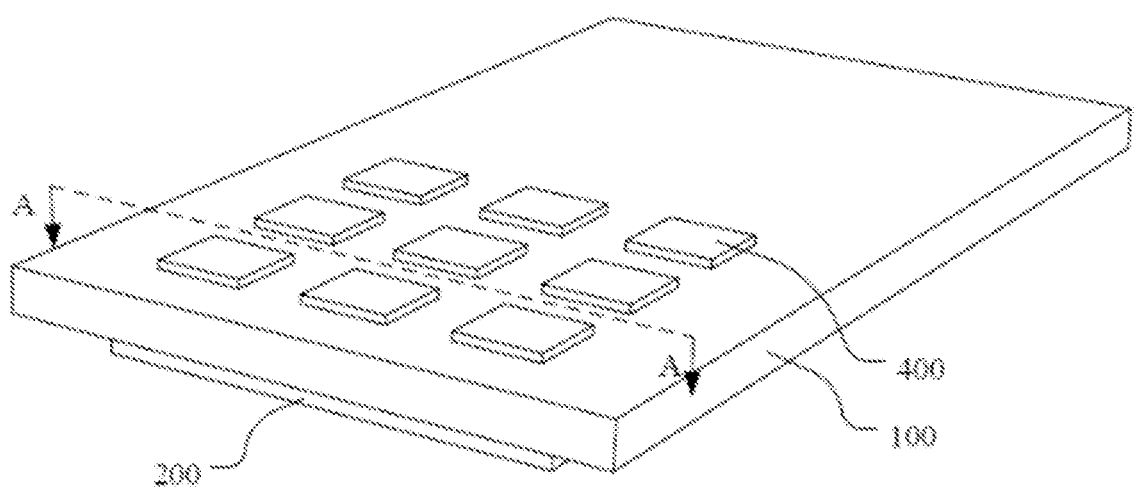
FIG. 5a illustrates a three dimensional view showing a portion of a circuit board assembly according to an embodiment of the present disclosure.

FIG. 1a to FIG. if illustrate sectional views showing stages in a connection method for a chip and a circuit board according to an embodiment of the present disclosure, which are taken along the AA line in FIG. 5a. FIG. 2a to FIG. 2c illustrate top views showing one or more stages in a connection method for a chip and a circuit board according to an embodiment of the present disclosure. FIG. 3 illustrates a schematic diagram showing an operating station according to an embodiment of the present disclosure.

As illustrated in FIG. 1a, a chip 200 is placed, with one surface of the chip 200 on which a contact 201 is provided facing upward. For simplicity, FIG. 1a illustrates only one contact 201. However, an arbitrary number of contact(s) 201 may be provided on the chip 200. Optionally, more than 60 contacts 201 may be provided. For example, 256, 512 or more contacts 201 may be provided (referring to FIG. 2a).

Optionally, an operation station 500 illustrated in FIG. 3 may be configured to fix the chip 200. The operation station 500 includes an accommodating slot 501, a guiding slot 502 and a vacuum pump joint 503. The step of placing the one surface of the chip 200 on which the contact 201 is provided as facing upward as described above is performed as follows. Particularly, the chip 200 is pushed into the accommodating slot 501 along a front-rear direction of the guiding slot 502 which is an extending direction of the guiding slot 502, with one surface of the chip 200 with contacts 201 facing upward. The accommodating slot 501 is connected with a vacuum pump tube (not shown in the drawings). The vacuum pump tube is connected with a vacuum pump via the vacuum pump joint 503, and the vacuum pump generates a negative pressure so as to fix the chip 200 into the accommodating slot 501. It should be noted that, the accommodating slot 501 may be connected with a vacuum tube (including but not limited to the vacuum pump tube), and the chip 200 can be fixed via a negative pressure caused by the vacuum environment so as to realize the technical effect of the present disclosure.

Figure 1B:
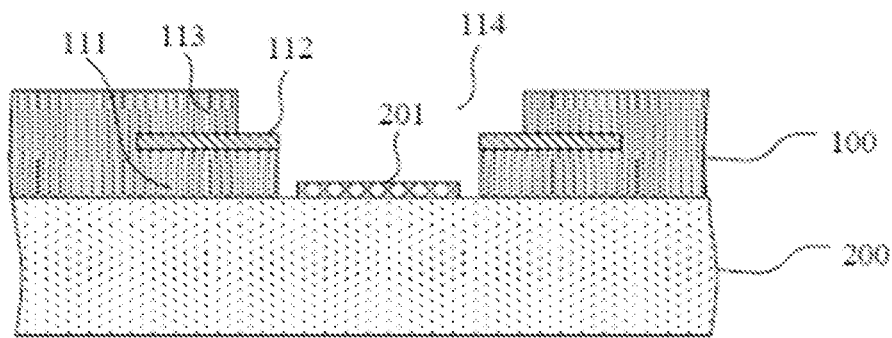

Further, as illustrated in FIG. 1B, a circuit board 100 is placed on the chip 200. The circuit board 100 has a first surface in contact with the chip 200 and has a plurality of through holes 114 aligned with a plurality of contacts 201 respectively.

Optionally, after the circuit board 100 is placed and the through holes 114 in the circuit board 100 are aligned with the contacts 201 of the chip 200, the circuit board 100 is fixed onto the chip 200. For example, a first adhesive is injected into a first positioning hole 115 (as illustrated in FIG. 2b) in the circuit board 100. The first positioning hole 115 extends through the circuit board 100 and is located in a non-metal region of the circuit board 100. Alternatively, the circuit board 100 is fixed on the chip 200 using an adhesive tape.

Figure 1C:
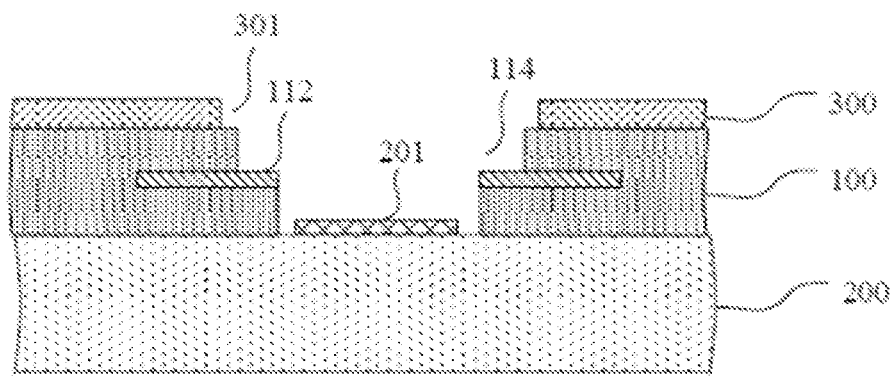

Further, as illustrated in FIG. 1c, a mask 300 is placed on a second surface of the circuit board 100, and the mask 300 has a plurality of openings 301 aligned with the plurality of through holes 114 respectively. The mask 300 may be a thin film formed of one of several kinds of available polymers and/or metal materials, for example, a polyimide mask. The mask 300 may be optionally a mask of parylene. The mask 300 may be manufactured for example using the manufacturing method as illustrated in FIG. 4a to FIG. 4f.

Optionally, after the mask 300 is placed and the openings 301 in the mask 300 are aligned with the through holes 114 of the circuit board 100, the mask 300 is fixed onto the circuit board 100. For example, a second adhesive is injected into a second positioning hole 302 (as illustrated in FIG. 2c) in the mask 300. The second positioning hole 302 extends through the mask 300, and the second adhesive is connected with a non-metal region of the circuit board 100. Alternatively, the mask 300 is fixed onto the circuit board 100 using an adhesive tape.

Figure 1D:
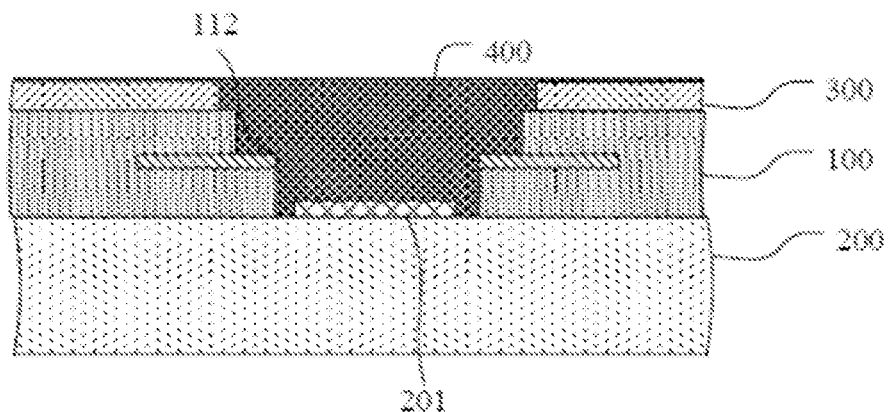

Further, as illustrated in FIG. 1d, a surface of the mask 300 is covered by a conductive adhesive 400 to fill the plurality of through holes 114 and the plurality of openings 301 with the conductive adhesive 400. For example, the conductive adhesive 400 is dripped onto the mask 300, and sequentially flows through the opening 301 and the through hole 114 to the contact 201 from up to down due to the liquidity of the conductive adhesive 400, so as to form an electrical connection between the contact 201 and the metal layer 112 in the through hole 114. The conductive adhesive 400 may be any one of silver-based conductive adhesive, gold-based conductive adhesive, platinum-based conductive adhesive, copper-based conductive adhesive and carbon-based conductive adhesive or any combination thereof. Optionally, the conductive adhesive 400 may be silver-based conductive adhesive, for example, silver-carbon-epoxy adhesive.

In an optional embodiment, as illustrated in a partial enlarged diagram in FIG. 2c, the opening 301 has a cross-sectional area greater than that of the through hole 114, and the through hole 114 has a cross-sectional area greater than that of the contact 201. In this way, the conductive adhesive 400 could completely cover the contact 201, so as to guarantee the reliability of the electrical connection between the metal layer 112 and the contact 201.

Figure 1E:
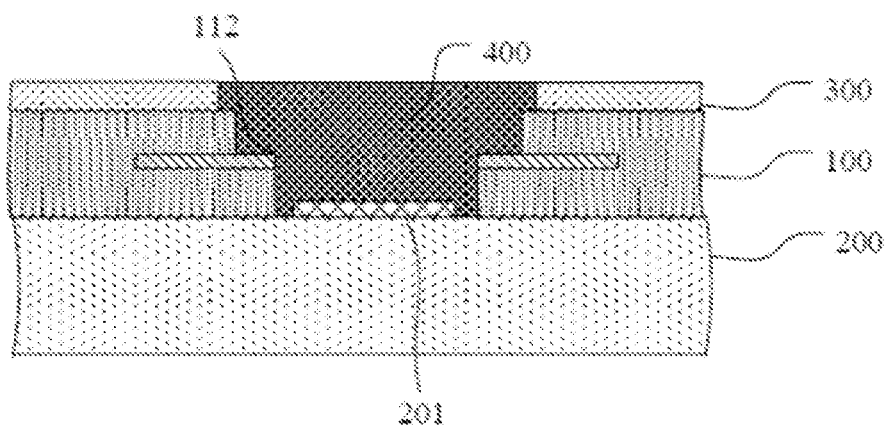

Further, as illustrated in FIG. 1e, portions of the conductive adhesive 400 in the plurality of through holes 114 are kept spaced apart from each other. The portions of the conductive adhesive 400 that fill the plurality of through holes 114 remain to provide an electrical connection between the circuit board 100 and the chip 200. In this step, the conductive adhesive 400 on the surface of the mask 300 is removed to keep the portions of the conductive adhesive 400 in the plurality of through holes 114 spaced apart from each other. Optionally, before removing the conductive adhesive 400 on the surface of the mask 300, a first baking process is performed on the conductive adhesive 400 to reduce the fluidity of the conductive adhesive 400, so as to facilitate removing the conductive adhesive 400 on the surface of the mask 300 by a scraping method.

Figure 1F:
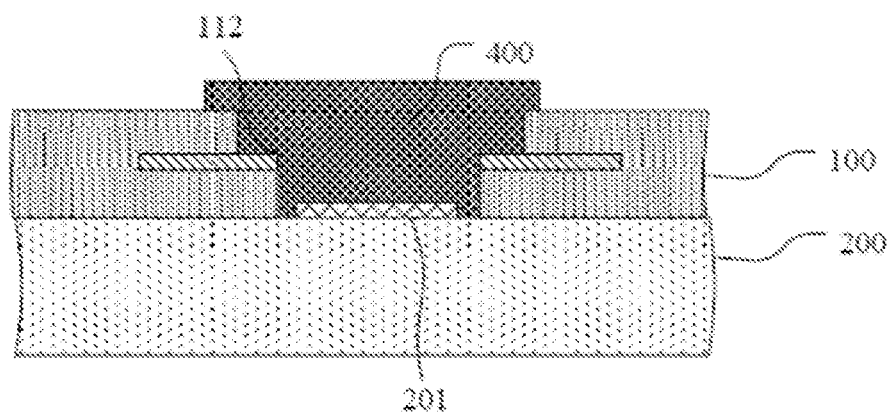

Further, as illustrated in FIG. 1f, the mask 300 is removed. For example, the mask 300 is removed through mechanical peeling or by immersion in a chemical agent. Optionally, after removing the mask 300, a second baking process is performed on the conductive adhesive 400 to cure and solidify the conductive adhesive 400.

In some other optional embodiments, the first baking process may be performed on the conductive adhesive 400 at a different time. For example, before performing the step illustrated in the FIG. 1*d*, the first baking process is performed on the conductive adhesive 400 to reduce the fluidity of the conductive adhesive 400, and then the steps illustrated in FIG. 1*d* to FIG. 1*f* are performed sequentially. That is, after the surface of the mask 300 is covered by the conductive adhesive 400 which has been subject to the first baking process, portions of the conductive adhesive 400 on the surface of the mask 300 and the mask 300 are sequentially removed, and then, the second baking process is performed on the conductive adhesive 400 to cure and solidify the conductive adhesive 400.

In the above embodiment, the mask 300 is covered by the conductive adhesive 400, so as to form an electrical connection between the plurality of contacts 201 and the circuit board 100 in one time. In this way, the manufacturing process can be simplified and the reliability in the electrical connection between the chip 200 and the circuit board 100 can be guaranteed, thereby avoiding occurrence of short circuiting or open circuiting. In addition, the method is simple in process, can increase yield rate of the process and can guarantee a normal operation of the chip 200 under a size constraint. Furthermore, the connection method is especially suitable for miniaturized electronic devices.

FIG. 4*a* to FIG. 4*f* illustrate sectional views showing various stages in the manufacturing method for an mask according to an embodiment of the present disclosure.

Figure 4A:
FIG. 4a to FIG. 4f illustrate sectional views showing the stages of a manufacturing method for a mask according to an embodiment of the present disclosure.

As illustrated in FIG. 4*a*, the manufacturing method starts from a substrate 310 and a first photoresist layer 311 on the substrate 310. The substrate 310 is configured to provide mechanical support. The first photoresist layer 311 is configured to protect the substrate 310 in an etching process and to serve as a sacrificial layer in the step of releasing the mask 300. In some other optional embodiments of the present disclosure, the first photoresist layer 311 may be omitted to lower the cost and to simplify the manufacturing process.

Optionally, in the above step, the substrate 310 may be a wafer. Firstly, the wafer is cleaned. Then, a surface of the wafer is coated with a negative photoresist through spin coating, and a hard baking process is performed on the negative photoresist to form the first photoresist layer 311.

Figure 4B:
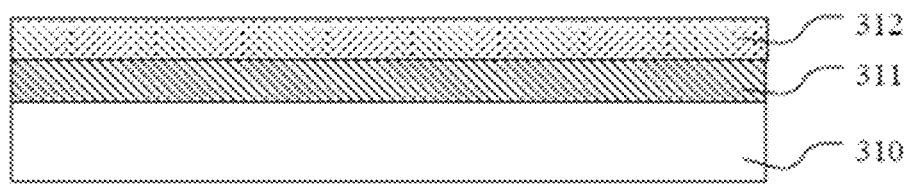

Further, as illustrated in FIG. 4*b*, a mask layer 312 is formed on the first photoresist layer 311. Taking the mask layer 312 made from parylene as an example, the mask layer 312 is formed through a chemical vapor deposition (CVD) process. The CVD device for depositing parylene includes a vaporization system and a deposition system. The vaporization system includes two stages. In a first stage, parylene in a powdered form is heated in vacuum to be vaporized; and in a second stage, the vaporized parylene is transferred into a furnace chamber and is pyrolyzed into monomers (paraxylene as free radicals) at a preset temperature. Next, the monomers (paraxylene as free radicals) are provided into the deposition system. In the deposition system, the monomers are cooled and are deposited to form a parylene layer.

Figure 4C:
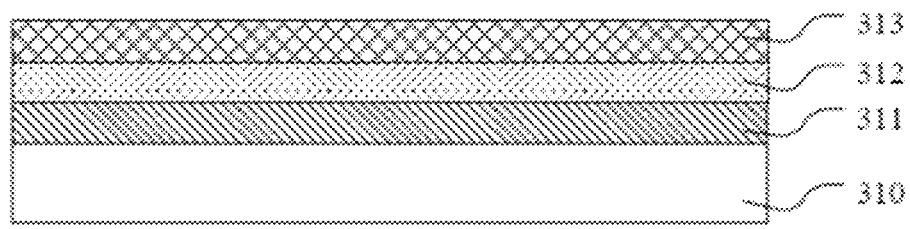

Further, as illustrated in FIG. 4*c*, an etch shielding layer 313 is formed on the mask 312. In this step, optionally, the etch shielding layer 313 is made from metal such as aluminium, titanium, gold, chromium, nickel and so on. For example, the etch shielding layer 313 is an aluminium layer which may be formed through vaporization or spraying.

Figure 4D:
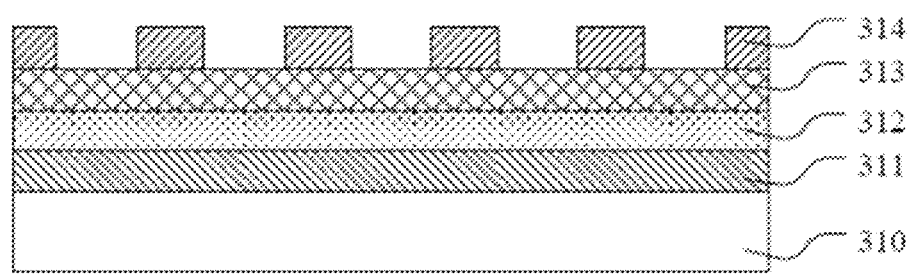

Further, as illustrated in FIG. 4*d*, a second patterned photoresist layer 314 is formed on the etch shielding layer 313 to expose parts of a surface of the etch shielding layer 313. For example, when the etch shielding layer 313 is an aluminium layer, a surface of the aluminium layer is subject to a spin coating process to form the second photoresist layer 314 and then the second photoresist layer 314 is patterned through exposure and development.

Figure 4E:
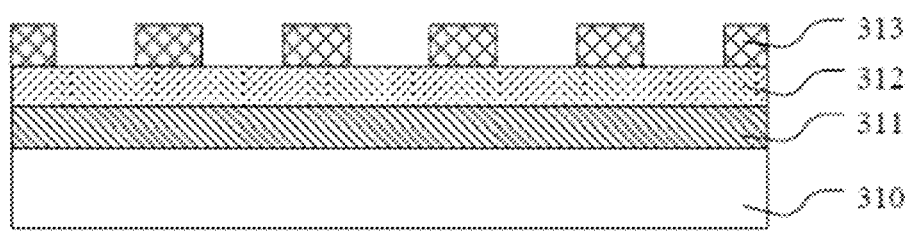

Further, as illustrated in FIG. 4*e*, the etch shielding layer 313 is patterned. An exposed surface of the etch shielding layer 313 is subject to a surface treatment by a plasma etching process, and openings are formed on the exposed surface using an etching solution. Optionally, after forming an opening of the etch shielding layer 313, the etch shielding layer 313 is cleaned and dried by spin-drying to remove residue etching solution and the second photoresist layer 314.

Optionally, the steps illustrated in FIG. 4*c* to FIG. 4*e* may be omitted. That is, the etch shielding layer 313 may be omitted, and the surface of the mask layer 312 is directly covered by a second patterned photoresist layer 314 which serves as an etch shielding layer.

Figure 4F:
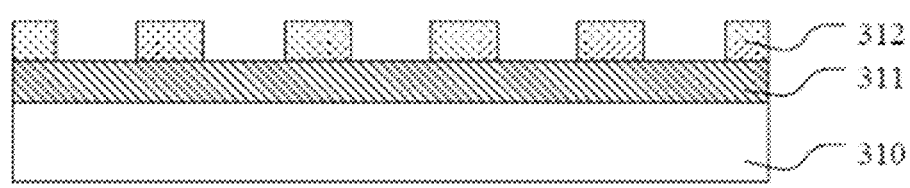

Further, as illustrated in FIG. 4*f*, the mask layer 312 is patterned. In this step, an opening is formed in the mask layer 312 using an anisotropic dry etching process. After the opening is formed in the mask layer 312, the etch mask layer 313 is removed, the first photoresist layer 311 is dissolved, and the substrate 310 is removed, and then water washing and baking processes are performed, and the mask layer 312 is left, forming a mask having an opening.

Figure 5B:
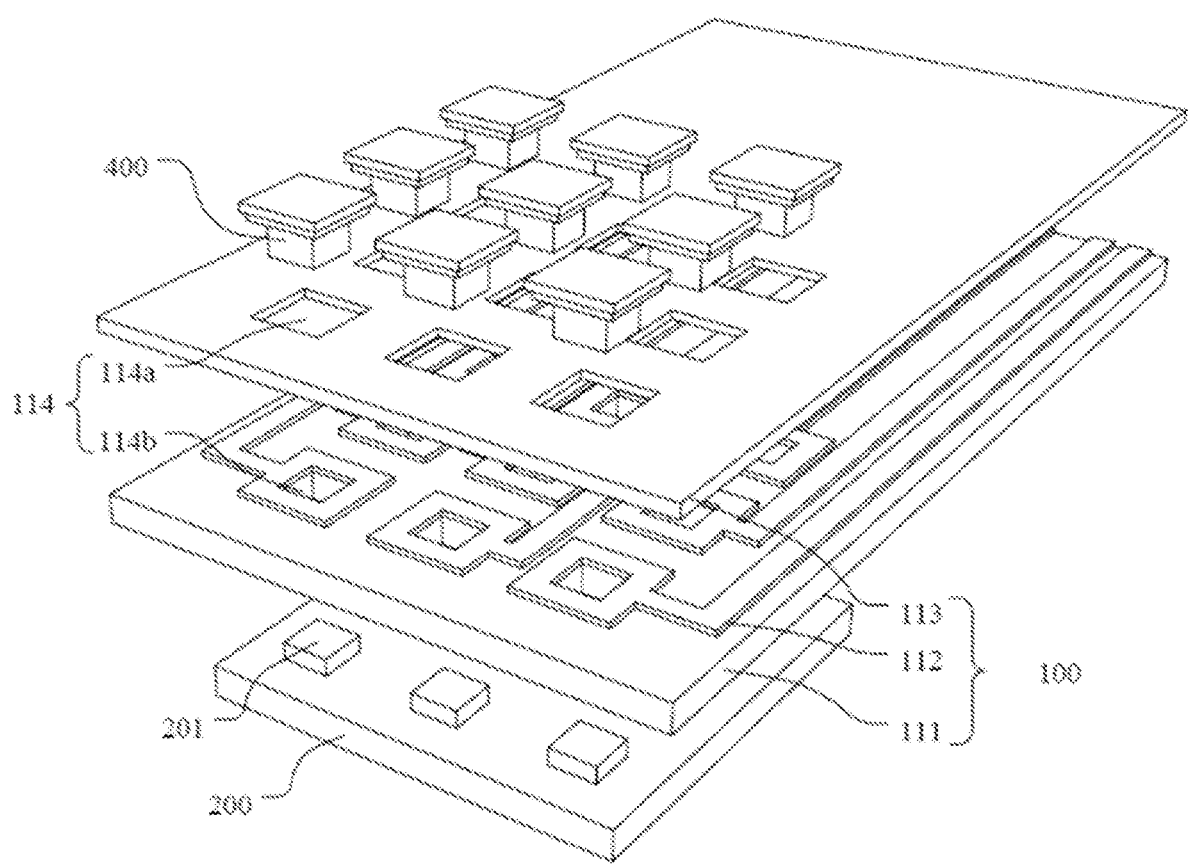
FIG. 5b illustrates an exploded view showing a portion of a circuit board assembly according to an embodiment of the present disclosure.

FIG. 5*a* and FIG. 5*b* illustrate a three dimensional view and an exploded view showing a portion of a circuit board assembly according to an embodiment of the present disclosure. The circuit board assembly includes the circuit board 100, the chip 200 and the conductive adhesive 400.

The circuit board 100 has a plurality of through holes 114 extending through the circuit board 100. The chip 200 includes a plurality of contacts 201 aligned with the plurality of through holes 114. The chip 200 is connected to a first surface of the circuit board 100 via a conductive adhesive 400. At least a portion of the conductive adhesive 400 is filled into each of the plurality of through holes 114, and extends over a preset height from a second surface of the circuit board 100 towards a direction that faces away from the second surface so as to form a free end. The free end of the conductive adhesive 400 has a flat surface, the second surface is opposite to the first surface, and the conductive adhesive 400 provides an electrical connection between the circuit board 100 and the chip 200.

In this embodiment, the above free end of the conductive adhesive 400 has a cross-sectional area greater than that of the conductive adhesive in the through hole 114. A cross section of the conductive adhesive 400 is taken along the AA line in the vertical direction, the conductive adhesive 400 has a T-shaped cross section, thereby enlarging the contact area between the conductive adhesive 400 and the circuit board 100, and enhancing the bonding strength between the chip 200 and the circuit board 100.

Optionally, the circuit board 100 includes a first insulation layer 111, a metal layer 112 and a second insulation layer 113. The metal layer 112 is located between the first insulation layer 111 and the second insulation layer 113. Each through hole 114 extends through the first insulation layer 111, the metal layer 112 and the second insulation layer 113. A through hole 114*a* in the second insulation layer 113 has a cross-sectional area that is greater than that of a through hole 114*b* in the first insulation layer 111 to expose a part of a surface of the metal layer 112. The exposed surface of the metal layer 112 is configured for electrical connection.

Optionally, the first insulation layer 111 and the second insulation layer 113 may be made from any of poly(methyl methacrylate) (PMMA), Teflon, silicon resin, polyimide, polyethylene terephthalate, or poly-p-xylylene (parylene).

In the embodiments of the present disclosure, the chip 200 and the mask 300 are positioned on two opposite sides of the through holes 114 of the circuit board 100. Optionally, the exposed surface of the first insulation layer 111 is the first surface of the circuit board 100, and the exposed surface of the second insulation layer 113 is the second surface of the circuit board 100, facilitating the flow of the conductive adhesive 400 into the through holes 114.

In this embodiment, the above free end of the conductive adhesive 400 has a cross-sectional area greater than that of the portion of the conductive adhesive 400 in the through hole 114a, and the portion of the conductive adhesive 400 in the through hole 114a has a cross-sectional area greater than that of the portion of the conductive adhesive 400 in the through hole 114b. A cross section of the conductive adhesive 400 is taken along the AA line in the vertical direction, the conductive adhesive 400 has a step-shaped cross section, enlarging the contact area between the conductive adhesive 400 and the circuit board 100, enhancing the bonding strength between the chip 200 and the circuit board 100 and reducing the contact resistance between the chip 200 and the circuit board 100.

Figure 6:
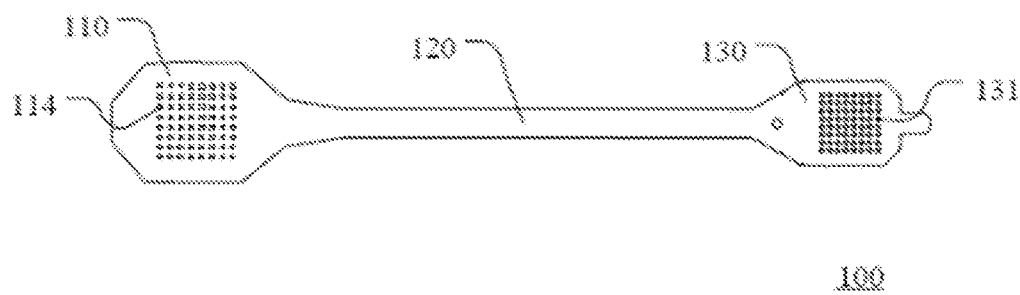
FIG. 6 illustrates a schematic diagram showing a circuit board according to an embodiment of the present disclosure.

FIG. 6 illustrates a schematic diagram of a circuit board 100 according to an embodiment of the present disclosure. The circuit board 100 includes a lead-in part 110, a cable 120 and a stimulation end 130. Optionally, the circuit board 100 may be a flexible electrode, which may be applied in an implantable device, such as an artificial cochlea implant, a retina stimulation based-visual prosthesis, a cerebral cortex stimulation based-visual prosthesis, a spinal cord stimulator, a brain stimulator and other implantable devices, to realize a corresponding functional recovery such as for visual sense or auditory sense or pain relief and others. A flexible electrode may avoid possible damages to a tissue when being in contact with the tissue, and can guarantee high biological compatibility and reliability. In an alternative embodiment, the circuit board 100 may be any kind of circuit board having through holes 114.

The lead-in part 110 is provided with a plurality of through holes 114. Each of the through holes 114 is configured to be filled with conductive material to allow the lead-in part 110 to be connected with a chip. The cable 120 may include, at its surface or in its interior, a metal layer (not illustrated) corresponding to the stimulation end 130. The stimulation end 130 is provided thereon with a plurality of stimulation electrodes 131 which are connected to the lead-in part 110 via the cable 120, and then are connected to the chip via the through holes 114 to form a complete stimulation circuit. As an embodiment, the plurality of stimulation electrodes 131 may be configured as an array of electrodes arranged in rows and columns.

A circuit board in an implantable device is taken as an example in this embodiment. However, the circuit board in the present disclosure is not limited to a flexible electrode, and the electronic device is not limited to an implantable device. The circuit board 100 may be an arbitrary-shaped circuit board made of an insulation layer and a metal layer, to realize connection with the chip to form various kinds of electronic devices.

Optionally, in an embodiment of the present disclosure, a protection film (not illustrated in the drawings) integrally encapsulating the surfaces of the circuit board assembly is further included. The protection film may be one or more of a parylene film, a polyimide film, a polypropylene film, a polyethylene terephthalate film, and a silicone film. The protection film can provide protection against mechanical damage, erosion by water vapor and chemical corrosion, improving the reliability and stability of the circuit board assembly.

The above description has been given with respect to some embodiments of the present disclosure in which not all the details are specifically described. However, the present disclosure is not limited to the description of the above embodiments. Apparently, based on the above description, various amendments and changes may be made. The above embodiments in the present disclosure are selected and described in detail for better explaining the principle and practical application of the present disclosure, so as to allow a person skilled in the art to better utilize the present disclosure and amendments based on the present disclosure. The present disclosure is limited to only the scope of claims and their equivalents.

What is claimed is:

1. A connection method for a chip and a circuit board, comprising:
   placing the chip into an accommodating slot of an operating station, the accommodating slot being connected with a vacuum tube to fix the chip;
   placing the circuit board on the fixed chip, the circuit board having a first surface in contact with the chip, the chip having a plurality of contacts, the plurality of contacts being arranged in rows and columns to form as an array, and the circuit board having a plurality of through holes aligned with the plurality of contacts respectively;
   placing a mask on a second surface of the circuit board, the mask having a plurality of openings aligned with the plurality of through holes respectively;
   covering a surface of the mask with a conductive adhesive to fill the plurality of through holes with the conductive adhesive; and
   keeping portions of the conductive adhesive that are respectively in the plurality of through holes to be spaced apart from each other, wherein the portions of the conductive adhesive that fill the plurality of through holes remain so as to provide an electrical connection between the circuit board and the chip.

2. The connection method according to claim 1, wherein said keeping the portions of the conductive adhesive that are respectively in the plurality of through holes to be spaced apart from each other comprises removing the conductive adhesive on the surface of the mask.

3. The connection method according to claim 2, wherein said keeping the portions of the conductive adhesive that are respectively in the plurality of through holes to be spaced apart from each other further comprises removing the mask.

4. The connection method according to claim 3, further comprising:
   performing, before said removing the conductive adhesive on the surface of the mask, a first baking process on the conductive adhesive; and/or
   performing, after said removing the mask, a second baking process on the conductive adhesive.

5. The connection method according to claim 1, wherein said covering the surface of the mask with the conductive adhesive comprises:
   performing a first baking process on the conductive adhesive;
   covering the surface of the mask with the conductive adhesive;

removing the conductive adhesive on the surface of the mask;

removing the mask; and performing a second baking process on the conductive adhesive.

6. The connection method according to claim 1, wherein the circuit board further comprises a first positioning hole, and the method further comprises:

forming, after said placing the circuit board on the chip, a first adhesive agent in the first positioning hole.

7. The connection method according to claim 6, wherein the first positioning hole extends through the circuit board, and the first positioning hole is located in a non-metal region of the circuit board.

8. The connection method according to claim 1, wherein the mask further comprises a second positioning hole, and the method further comprises:

forming, after said placing the mask on the second surface of the circuit board, a second adhesive agent in the second positioning hole.

9. The connection method according to claim 8, wherein the second positioning hole extends through the mask, and the second adhesive agent is connected to a non-metal region of the circuit board.

10. The connection method according to claim 1, wherein each of the plurality of openings has a cross-sectional area greater than that of the through hole, and each of the plurality of through holes has a cross-sectional area greater than that of the contact.

11. A circuit board assembly, comprising:

a circuit board having a plurality of through holes;

a chip located on a first surface of the circuit board, the chip having a plurality of contacts aligned with the plurality of through holes, the plurality of contacts being arranged in rows and columns to form as an array; and a conductive adhesive filled into each of the plurality of through holes, the conductive adhesive extending outwards over a preset height from a second surface of the circuit board so as to form a free end, the free end of the conductive adhesive having a flat surface, the second surface being opposite to the first surface, and the conductive adhesive providing an electrical connection between the circuit board and the chip, wherein the circuit board assembly is manufactured by the connection method according to claim 1.

12. The circuit board assembly according to claim 11, wherein the conductive adhesive has a step-shaped or T-shaped cross-section.

13. The circuit board assembly according to claim 11, wherein the free end has a cross-sectional area greater than that of the conductive adhesive in each of plurality of the through holes.

14. The circuit board assembly according to claim 11, wherein the circuit board comprises a first insulation layer, a second insulation layer and a metal layer provided between the first insulation layer and the second insulation layer, and each of the plurality of through holes extends through the first insulation layer, the metal layer and the second insulation layer;

wherein each of the plurality of through holes has a cross-sectional area in the second insulation layer that is greater than that in the first insulation layer to expose a part of a surface of the metal layer; and the first surface is an exposed surface of the first insulation layer, and the second surface is an exposed surface of the second insulation layer.

15. An electronic device, comprising the circuit board assembly according to claim 11.

* * * * *